(12) United States Patent
Suzuki et al.

(10) Patent No.: US 10,892,790 B2
(45) Date of Patent: Jan. 12, 2021

(54) RECEPTION APPARATUS AND RECEPTION METHOD

(71) Applicant: SONY SEMICONDUCTOR SOLUTIONS CORPORATION, Kanagawa (JP)

(72) Inventors: Norihito Suzuki, Kanagawa (JP); Noboru Sasho, Kanagawa (JP); Nobuhisa Ozawa, Kanagawa (JP)

(73) Assignee: SONY SEMICONDUCTOR SOLUTIONS CORPORATION, Kanagawa (JP)

(*) Notice: Subject to any disclaimer, the term of this patent is extended or adjusted under 35 U.S.C. 154(b) by 0 days.

(21) Appl. No.: 16/333,024

(22) PCT Filed: Aug. 23, 2017

(86) PCT No.: PCT/JP2017/030089
§ 371 (c)(1),
(2) Date: Mar. 13, 2019

(87) PCT Pub. No.: WO2018/096741
PCT Pub. Date: May 31, 2018

(65) Prior Publication Data
US 2019/0273522 A1    Sep. 5, 2019

(30) Foreign Application Priority Data
Nov. 24, 2016   (JP) .................... 2016-227662

(51) Int. Cl.
*H04B 1/10* (2006.01)
*H03H 11/12* (2006.01)
*H03H 11/04* (2006.01)

(52) U.S. Cl.
CPC .......... *H04B 1/1036* (2013.01); *H03H 11/12* (2013.01); *H04B 1/10* (2013.01); *H03H 2011/0494* (2013.01)

(58) Field of Classification Search
CPC . H03H 11/12; H04B 1/06; H04B 1/10; H04B 1/16; H04B 1/1036; H04B 7/00;
(Continued)

(56) References Cited

U.S. PATENT DOCUMENTS 7,020,186 B2 * 3/2006 McReynolds ........... H04L 5/143
                                                    370/376
7,593,706 B2 * 9/2009 Bucknor ................. G01S 19/21
                                                    342/357.59
(Continued)

FOREIGN PATENT DOCUMENTS

CN    102100023 A    6/2011
EP    2288061 A1    2/2011
(Continued)

OTHER PUBLICATIONS

Shizue Sasaki, "Design Note of Filter Circuit", No. 6, Band Elimination Filter, Deign Wave Magazine, Sep. 2000, pp. 116-117.
(Continued)

*Primary Examiner* — Shawkat M Ali
(74) *Attorney, Agent, or Firm* — Chip Law Group

(57) ABSTRACT

The object is to simplify the configuration of a filter in a reception apparatus. The reception apparatus includes a filter. The filter provided in the reception apparatus selects a signal transmission characteristic that is one of a band stop characteristic or a low pass characteristic. Further, selection of the signal transmission characteristic in the filter provided in the reception apparatus is performed in response to a desired signal and an interference signal. In the filter provided in the reception apparatus, passage of the desired
(Continued)

signal and attenuation of the interference signal based on the selected signal transmission characteristic are executed.

10 Claims, 7 Drawing Sheets

(58) Field of Classification Search
CPC .. H04B 7/185; H04J 3/14; H04J 14/08; H04L 1/00; H04L 27/00; H04L 27/06; H04L 27/08; H04L 27/28; H04W 4/00; H04W 24/00; H04W 52/38
USPC ............... 327/310, 316; 370/210, 242, 310; 375/260, 316, 341, 346, 349, 350; 455/136, 255, 296, 307
See application file for complete search history.

(56) References Cited

U.S. PATENT DOCUMENTS

| | | | |
|---|---|---|---|
| 8,594,255 B2* | 11/2013 | Mashino | H04B 1/1027 327/310 |
| 8,755,477 B1* | 6/2014 | Park | H04B 7/0871 375/260 |
| 2009/0023411 A1* | 1/2009 | Katsube | H04B 1/1018 455/307 |
| 2011/0129047 A1 | 6/2011 | Mashino et al. | |
| 2017/0041163 A1* | 2/2017 | Nakagawa | H04W 72/0453 |

FOREIGN PATENT DOCUMENTS

| | | |
|---|---|---|
| JP | 2007-228342 A | 9/2007 |
| JP | 2010-016785 A | 1/2010 |
| JP | 2014-220587 A | 11/2014 |
| KR | 10-2011-0017006 A | 2/2011 |
| WO | 2010/010936 A1 | 1/2010 |

OTHER PUBLICATIONS

International Search Report and Written Opinion of PCT Application No. PCT/JP2017/030089, dated Nov. 7, 2017, 8 pages of ISRWO.

Shizue Sasaki, "Design Note of Filter Circuit", Design Wave Magazine, No. 6, Band Elimination Filter, Sep. 2000, pp. 116-117.

Shizue Sasaki, "Serialization Design Note of Filter Circuit No. 6 Band Elimination Filter", Design Wave Magazine, Sep. 2000, pp. 116-117.

* cited by examiner

| R1<br>(511, 515) | R2<br>(512, 516) | R3<br>(513, 517) | R4<br>(514, 518) | C1<br>(521, 524) | C2<br>(522, 525) | C3<br>(523, 526) |
|---|---|---|---|---|---|---|
| 1K | 1K | 0.5K | 1K | 6.3p | 10p | 0 |

| R1<br>(511, 515) | R2<br>(512, 516) | R3<br>(513, 517) | R4<br>(514, 518) | C1<br>(521, 524) | C2<br>(522, 525) | C3<br>(523, 526) |
|---|---|---|---|---|---|---|
| 1K | 1K | 0.7K | 1K | 12.5p | 20p | 5p |

F I G . 8
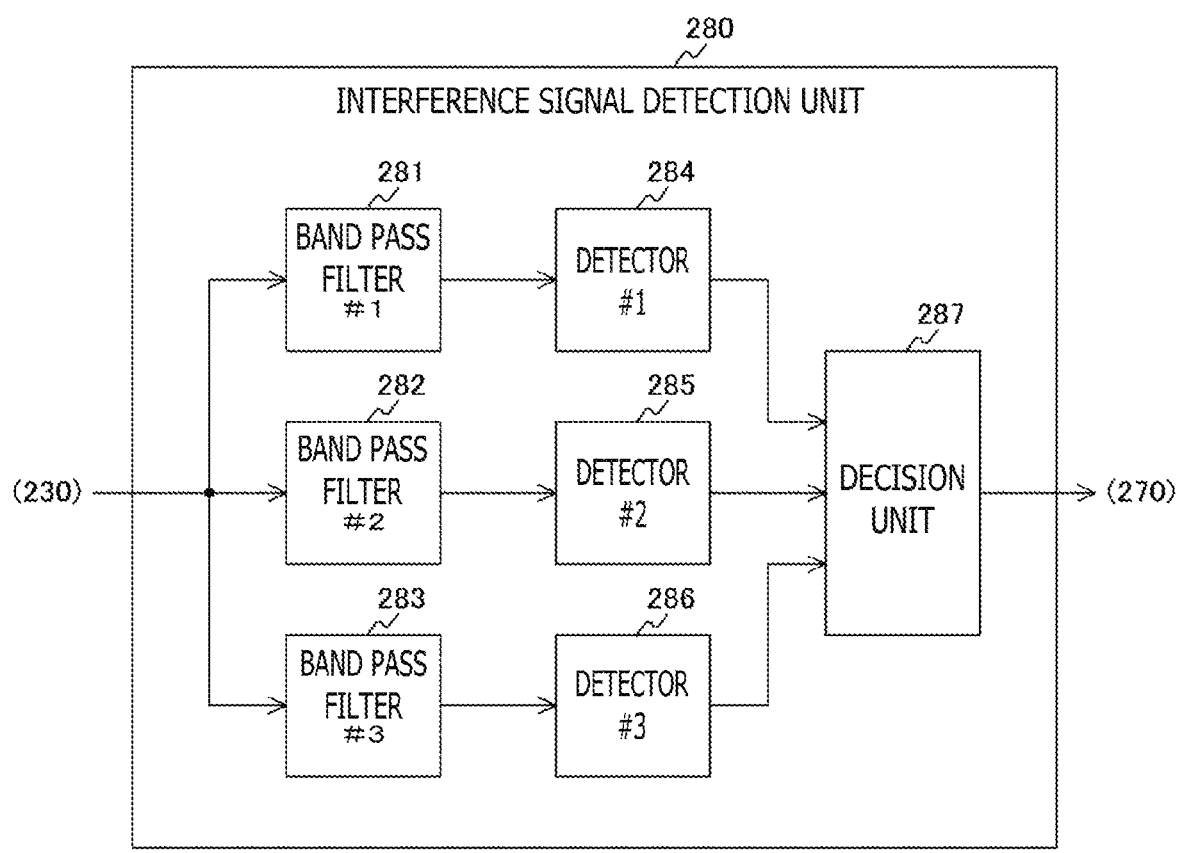

RECEPTION APPARATUS AND RECEPTION METHOD

CROSS REFERENCE TO RELATED APPLICATIONS

This application is a U.S. National Phase of International Patent Application No. PCT/JP2017/030089 filed on Aug. 23, 2017, which claims priority benefit of Japanese Patent Application No. JP 2016-227662 filed in the Japan Patent Office on Nov. 24, 2016. Each of the above-referenced applications is hereby incorporated herein by reference in its entirety.

TECHNICAL FIELD

The present technology relates to a reception apparatus and a reception method. Particularly, the present technology relates to a reception apparatus including a filter for attenuating an interference signal and a reception method.

BACKGROUND ART

Conventionally, a reception apparatus is used which attenuates an interference signal by a filter to receive a desired signal. For example, a reception apparatus is proposed in which a band pass filter that passes a signal wave of a desired channel and a notch filter that attenuates signal waves of channels adjacent to the channel are disposed (for example, refer to PTL 1).

CITATION LIST

Patent Literature

[PTL 1]
Japanese Patent Laid-open No. 2014-220587

SUMMARY

Technical Problem

In the conventional technology described above, a notch filter whose attenuation amount is in the maximum at a central frequency of a channel adjacent to a desired channel is disposed and a signal wave of the adjacent channel is removed as an interference signal. In this manner, the conventional technology described above has a problem in that, since two filters including a band pass filter and a notch filter are used, the reception apparatus is complex.

The present technology has been created in view of such a situation as described above, and it is an object of the present technology to simplify the configuration of a filter in a reception apparatus.

Solution to Problem

The present technology has been made to eliminate the problem described above, and a first aspect of the present technology is a reception apparatus including a filter configured to select a signal transmission characteristic that is one of a band stop characteristic or a low pass characteristic in response to a desired signal and an interference signal, and a reception method. This results in the action that one of the band stop characteristic or the low pass characteristic is selected in response to the desired signal and the interference signal.

Further, in the present first aspect, the band stop characteristic of the filter may be a characteristic that an attenuation amount in a region of a frequency higher than a stop band is greater than an attenuation amount in a region of a frequency lower than the stop band. This results in the action that, in the case where the band stop characteristic is selected, the attenuation of a signal in a region of a frequency higher than the stop band becomes greater than the attenuation of a signal in a region of a frequency lower than the stop band.

Further, in the present first aspect, the filter may select the signal transmission characteristic by changing a characteristic value of the filter. This results in the action that selection of the signal transmission characteristic of the filter is performed by changing the characteristic value.

Further, in the present first aspect, the filter may select the signal transmission characteristic in response to a difference between a frequency of the desired signal and a central frequency of the interference signal. This results in the action that the signal transmission characteristic is selected in response to the difference between the frequency of the desired signal and the central frequency of the interference signal.

Further, in the present first aspect, the filter may select the signal transmission characteristic in response to a difference in signal level between the desired signal and the interference signal. This results in the action that the signal transmission characteristic is selected in response to the difference in signal level between the desired signal and the interference signal.

Further, in the present first aspect, the filter may change a central frequency of a stop band in the band stop characteristic in response to the interference signal. This results in the action that the central frequency of the stop band is changed in response to the interference signal.

Further, in the present first aspect, the filter may change a cutoff frequency in response to the desired signal and the interference signal. This results in the action that the cutoff frequency is changed in response to the desired signal and the interference signal.

Further, in the present first aspect, the filter may change the cutoff frequency to a frequency between frequencies of the desired signal and the interference signal. This results in the action that the cutoff frequency is changed to a frequency between the frequencies of the desired signal and the interference signal.

Further, in the present first aspect, the reception apparatus may further include a control unit configured to generate a control signal in response to the desired signal and the interference signal, and the filter may select the signal transmission characteristic based on the generated control signal. This results in the action that the signal transmission characteristic is selected based on the generated control signal.

Further, in the present first aspect, the reception apparatus may further include an interference signal detection unit configured to detect the interference signal, and the control unit may generate the control signal in response to the desired signal and the detected interference signal. This results in the action that the control signal is generated in response to the detected interference signal.

Advantageous Effect of Invention

With the present technology, a superior advantageous effect that the configuration of a filter in a reception apparatus is simplified can be achieved. It is to be noted that the

BRIEF DESCRIPTION OF DRAWINGS

FIG. 8 is a view depicting an example of a configuration of an interference signal detection unit 280 in the second embodiment of the present technology.

DESCRIPTION OF EMBODIMENTS

In the following, modes for carrying out the present technology (hereinafter referred to as embodiments) are described. It is to be noted that the description is given in the following order.

1. First Embodiment (example of a case in which a signal transmission characteristic is selected on the basis of information of a held interference signal)
2. Second Embodiment (example of a case in which an interference signal is detected)

1. First Embodiment

[Configuration of Image-Receiving Apparatus]

Figure 1:
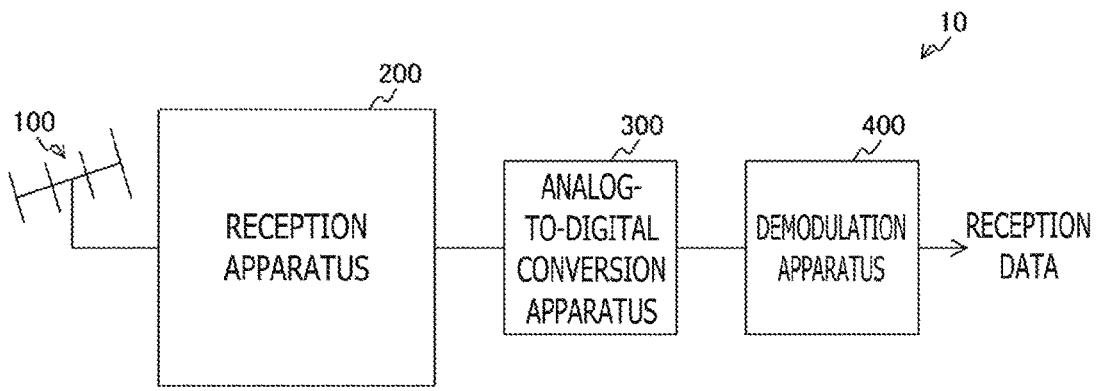
FIG. 1 is a view depicting an example of a configuration of an image-receiving apparatus 10 in embodiments of the present technology.

FIG. 1 is a view depicting an example of a configuration of an image-receiving apparatus 10 in the embodiments of the present technology. This image-receiving apparatus 10 includes an antenna 100, a reception apparatus 200, an analog-to-digital conversion apparatus 300 and a demodulation apparatus 400.

The antenna 100 converts a radio wave into an electric signal. This antenna 100 converts radio waves transmitted, for example, by terrestrial broadcasting or satellite broadcasting into high frequency signals.

The reception apparatus 200 selects a signal wave of a desired channel from the high frequency signals converted by the antenna 100, converts the signal wave into an intermediate frequency signal that is a signal wave of an intermediate frequency, and outputs the intermediate frequency signal. Details of a configuration of the reception apparatus 200 are hereinafter described.

The analog-to-digital conversion apparatus 300 performs analog-to-digital conversion for the intermediate frequency signal outputted from the reception apparatus 200 to generate a digital reception signal.

The demodulation apparatus 400 demodulates the digital reception signal generated by the analog-to-digital conversion apparatus 300. Further, in the case where the demodulated reception signal is in an encoded state, the demodulation apparatus 400 further performs decoding to generate reception data. This reception data includes a video signal and an audio signal and is outputted to the outside of the image-receiving apparatus 10.

It is to be noted that the configuration of the image-receiving apparatus 10 is not limited to this example. For example, also it is possible to connect a signal cable in place of the antenna 100 so as to receive a signal transmitted by cable broadcasting.

[Configuration of Reception Apparatus]

Figure 2:
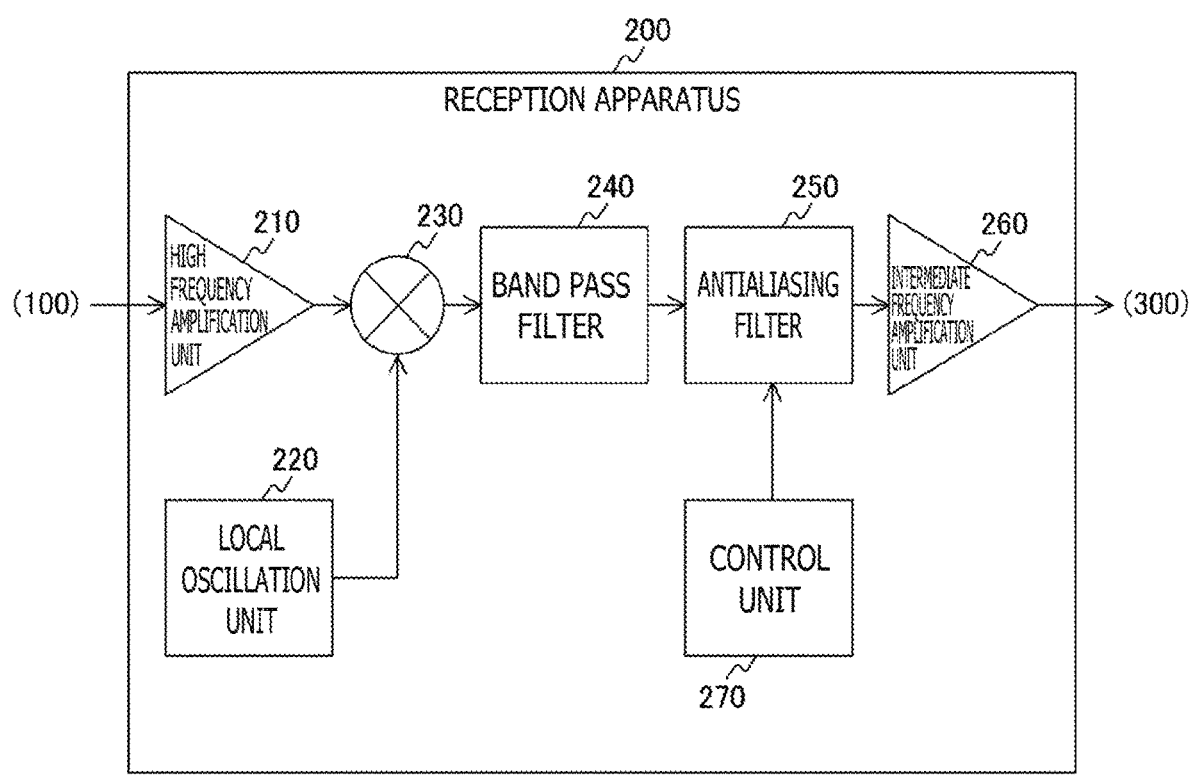
FIG. 2 is a view depicting an example of a configuration of a reception apparatus 200 in a first embodiment of the present technology.

FIG. 2 is a view depicting an example of a configuration of the reception apparatus 200 in the first embodiment of the present technology. This reception apparatus 200 includes a high frequency amplification unit 210, a local oscillation unit 220, a mixture unit 230, a band pass filter 240, an antialiasing filter 250, an intermediate frequency amplification unit 260 and a control unit 270.

The high frequency amplification unit 210 amplifies a high frequency signal outputted from the antenna 100. This high frequency amplification unit 210 outputs the amplified high frequency signal to the mixture unit 230. Further, the high frequency amplification unit 210 performs adjustment of the gain such that the signal level of the high frequency signal to be outputted has a predetermined value.

The local oscillation unit 220 generates a local oscillation signal of a frequency according to a channel selected by the image-receiving apparatus 10 and outputs the local oscillation signal to the mixture unit 230.

The mixture unit 230 converts the high frequency signal into an intermediate frequency signal. This mixture unit 230 down-converts the high frequency signal outputted from the high frequency amplification unit 210 and the local oscillation signal outputted from the local oscillation unit 220 by multiplication to generate an intermediate frequency signal.

The band pass filter 240 is a filter having a band pass characteristic. Here, the band pass characteristic is a characteristic by which a signal of frequencies included in a pass band having a predetermined bandwidth is passed while a signal of a frequency of any band other than the pass band is attenuated. This band pass filter 240 passes the intermediate frequency signal described above and attenuates interference signals that are signals of frequencies of bands other than the band of the intermediate frequency signal. Signals of channels adjacent to the selected channel can be removed by the band pass filter 240. In other words, the intermediate frequency signal can be made a signal having a band substantially equal to the pass band described above by the band pass filter 240. The band pass filter 240 outputs the intermediate frequency signal to the antialiasing filter 250.

The antialiasing filter 250 is a filter for preventing occurrence of aliasing when a signal is subject to analog-to-digital conversion. Analog-to-digital conversion of the intermediate frequency signal is performed by the analog-to-digital conversion apparatus 300 described hereinabove with reference to FIG. 1. At this time, if a signal of a frequency equal to or higher than ½ the sampling frequency is mixed into the input of the analog-to-digital conversion apparatus 300, then aliasing occurs and so-called aliasing noise is generated. Therefore, a signal of a frequency equal to or higher than ½ the sampling frequency is sufficiently attenuated to prevent occurrence of aliasing by the antialiasing filter 250. In this manner, the antialiasing filter 250 is a filter having a low pass characteristic as a signal transmission characteristic thereof.

Further, the antialiasing filter 250 can perform also attenuation of an interference signal that cannot be attenuated sufficiently by the band pass filter 240 described above. For example, in an environment in which a signal of wireless communication of LTE (Long Term Evolution) or the like is transmitted, a signal of wireless communication is sometimes mixed in the vicinity of the intermediate frequency signal. In such a case as just described, removal of the signal of wireless communication that is an interference signal cannot be performed sufficiently by the band pass filter 240. Therefore, attenuation of the interference signal is further performed by the antialiasing filter 250. In order to attenuate the interference signal more, the signal transmission characteristic of the antialiasing filter 250 can be changed to a band stop characteristic. Here, the band stop characteristic is a signal transmission characteristic of attenuating a signal of any frequency included in a stop band having a predetermined bandwidth and passing a signal of a frequency of any other band than the stop band. An interference signal can be attenuated by making the central frequency of the stop band and the central frequency of the band in which the interference signal is included equal to each other.

In the case where frequencies of the desired signal and the interference signal are proximate to each other as described above, in order to obtain a steep attenuation characteristic, it is necessary to adopt a filter having a high order as the antialiasing filter 250. However, a filter having a high order has a problem that the configuration is complex. Therefore, a notch filter that is a filter having a band stop characteristic is used. This notch filter is a filter having a high Q, that is, having a narrow width of a stop band and can pass a desired signal and attenuate an interference signal even if the frequencies of the desired signal and the interference signal are approximate to each other. By setting the signal transmission characteristic of the antialiasing filter 250 to a characteristic similar to that of a notch filter, it is possible to sufficiently attenuate only an interference signal without using a high order filter. This makes it possible to enhance the signal to noise ratio (SNR: Signal Noise Ratio). It is to be noted that the central frequency of the stop band of a notch filter is called notch frequency.

Further, the antialiasing filter 250 can be changed so as to have a characteristic that the attenuation amount of a signal in a region of a frequency higher than a stop band in a band stop characteristic is greater than the attenuation amount of a signal in a region of a frequency lower than the stop band. In this case, the antialiasing filter 250 can perform attenuation of an interference signal in its stop band and can further attenuate a signal of a frequency equal to ½ the sampling frequency, and the antialiasing effect can be enhanced.

By selecting one of the low pass characteristic and the band stop characteristic as a signal transmission characteristic of the antialiasing filter 250 in this manner, attenuation of a signal according to a use environment of the reception apparatus 200 can be performed. This selection can be performed in response to the intermediate frequency signal that is a desired signal and the interference signal. Also it is possible to change the cutoff frequency in the low pass characteristic and the band stop characteristic in response to the intermediate frequency signal and the interference signal. Such selection of a signal transmission characteristic and change of a cutoff frequency as described above can be performed by changing the characteristic value of the antialiasing filter 250. Details of the configuration of the antialiasing filter 250 are hereinafter described. It is to be noted that the antialiasing filter 250 is an example of the filter described in the claims.

The control unit 270 performs selection of a signal transmission characteristic of the antialiasing filter 250. This control unit 270 generates a control signal for selecting the low pass characteristic or the band stop characteristic and outputs the control signal to the antialiasing filter 250. For example, in the case where the frequency of the intermediate frequency signal and the central frequency of an interference signal are comparatively proximate to each other, the band stop characteristic can be selected to perform removal of the interference signal. On the other hand, in the case where the frequency of the intermediate frequency signal and the central frequency of the interference signal are comparatively separated from each other, the low pass characteristic can be selected to prevent occurrence of aliasing. This determination can be performed by comparison between the difference between the frequency of the intermediate frequency signal and the central frequency of the interference signal and a predetermined threshold value. Further, the control unit 270 can change the central frequency of the stop band or the notch frequency of the antialiasing filter 250 in response to the interference signal. In particular, the control unit 270 can set the central frequency of the stop band or the like of the antialiasing filter 250 to a frequency equal to the central frequency of the band of the interference signal. This makes it possible to sufficiently attenuate the interference signal.

Also it is possible to select a signal transmission characteristic of the antialiasing filter 250 in response to the signal levels of the intermediate frequency signal and the interference signal. For example, in the case where the signal level of the interference signal is high in comparison with the intermediate frequency signal, the band stop characteristic can be selected. On the other hand, in the case where the signal level of the interference signal is low, the low pass characteristic is selected to prevent occurrence of aliasing. This is because, since the signal level of the interference signal is low, the interference signal can be attenuated sufficiently by the antialiasing filter 250 that has a low pass characteristic. This determination can be performed by comparison between the difference between the signal levels of the intermediate frequency signal and the interference signal and a predetermined threshold value.

Further, the control unit 270 changes the cutoff frequency of the antialiasing filter 250 in response to the intermediate frequency signal and the interference signal. For example, in the case where the signal transmission characteristic of the antialiasing filter 250 is the band stop characteristic, the cutoff frequency can be set to a frequency between an upper limit to the band of the intermediate frequency signal and the frequency of the interference signal. This makes it possible to prevent excessive attenuation of the intermediate frequency signal while sufficiently attenuating the interference signal and so forth. On the other hand, in the case where the signal transmission characteristic of the antialiasing filter 250 is the low pass characteristic, the cutoff frequency is set to a frequency comparatively higher than the upper limit to the band of the intermediate frequency signal, by which attenuation of the intermediate frequency signal can be prevented while degradation of the SNR can be prevented.

Further, the control unit 270 holds information of a frequency of an interference signal estimated to be a band of an intermediate frequency signal for each broadcasting system or for each channel selected by a user or the like. On the basis of the held information, the control unit 270 selects a signal transmission characteristic, a cutoff frequency and so forth of the antialiasing filter 250 and generates and outputs a control signal to the antialiasing filter 250.

The intermediate frequency amplification unit 260 amplifies the intermediate frequency signal outputted from the antialiasing filter 250. The amplified intermediate frequency signal is outputted to the analog-to-digital conversion apparatus 300. Further, the intermediate frequency amplification unit 260 undergoes adjustment of the gain such that the signal level of the intermediate frequency signal to be outputted becomes a predetermined value.

[Configuration of Antialiasing Filter]

Figure 3:
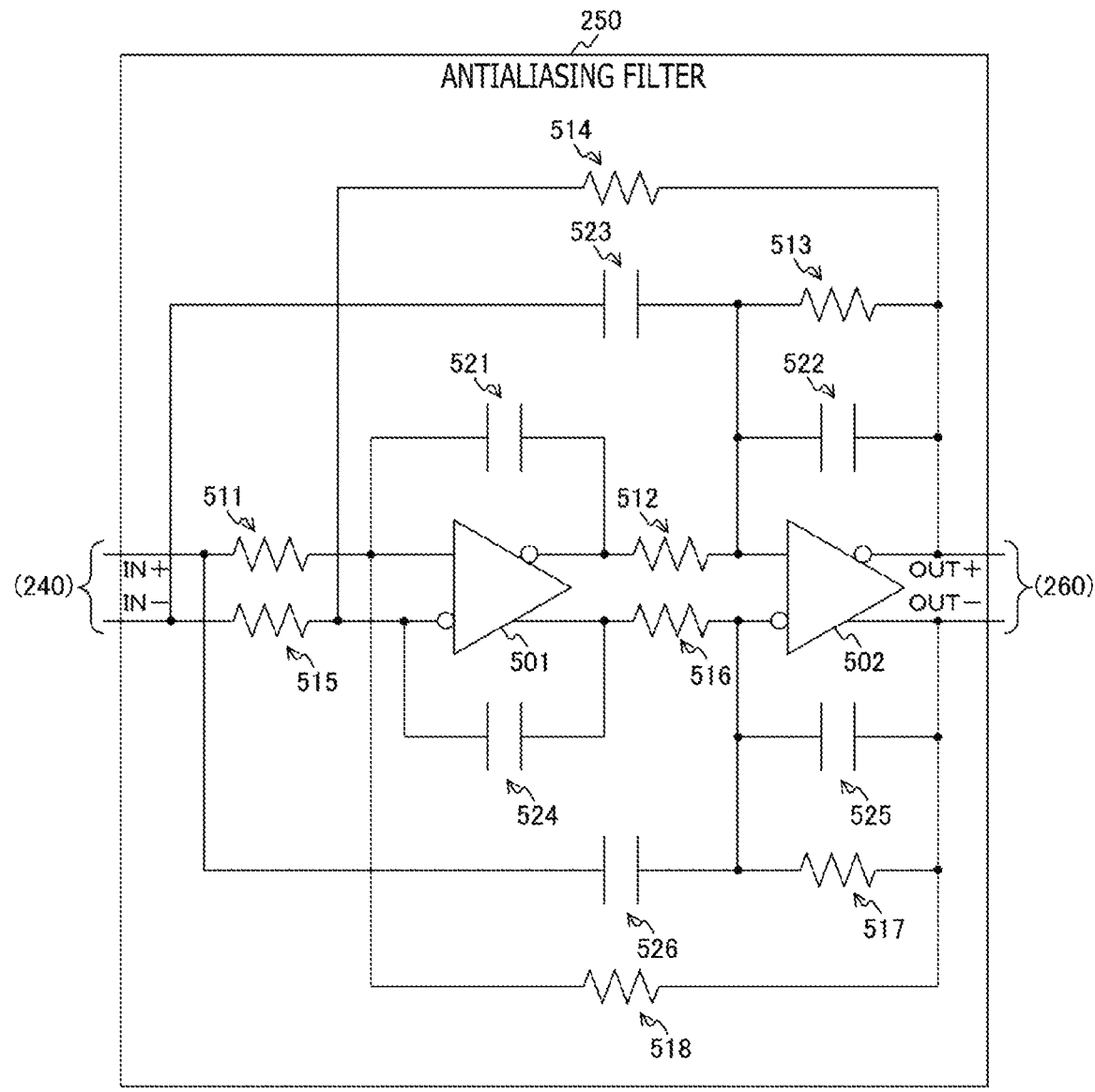
FIG. 3 is a view depicting an example of a configuration of an antialiasing filter 250 in the embodiments of the present technology.

FIG. 3 is a view depicting an example of a configuration of the antialiasing filter 250 in the embodiments of the present technology. This antialiasing filter 250 includes amplifiers 501 and 502, resistors 511 to 518, and capacitors 521 to 526. For the amplifiers 501 and 502, a differential input/output amplifier can be used. Further, the antialiasing filter 250 in the figure has input terminals IN+ and IN− and output terminals OUT+ and OUT−.

The capacitor 521 is connected between a non-inverting input terminal and an inverting output terminal of the amplifier 501, and the capacitor 524 is connected between an inverting input terminal and a non-inverting output terminal of the amplifier 501. The resistor 513 and the capacitor 522 connected in parallel are connected between a non-inverting input terminal and an inverting output terminal of the amplifier 502, and the resistor 517 and the capacitor 525 connected in parallel are connected between an inverting input terminal and a non-inverting output terminal of the amplifier 502. The input terminal IN+ is connected to the non-inverting input terminal of the amplifier 501 through the resistor 511, and the input terminal IN− is connected to the inverting input terminal of the amplifier 501 through the resistor 515. The inverting output terminal of the amplifier 501 is connected to the non-inverting input terminal of the amplifier 502 through the resistor 512, and the non-inverting output terminal of the amplifier 501 is connected to the inverting input terminal of the amplifier 502 through the resistor 516.

The input terminal IN+ is connected to the inverting input terminal of the amplifier 502 through the capacitor 526, and the input terminal IN− is connected to the non-inverting input terminal of the amplifier 502 through the capacitor 523. The non-inverting input terminal of the amplifier 501 is connected to the non-inverting output terminal of the amplifier 502 through the resistor 518, and the inverting input terminal of the amplifier 501 is connected to the inverting output terminal of the amplifier 502 through the resistor 514. The inverting output terminal of the amplifier 502 is connected to the output terminal OUT+ and the non-inverting output terminal of the amplifier 502 is connected to the output terminal OUT−.

The antialiasing filter 250 in the figure is an active filter having a bi-quadratic configuration. In the figure, the resistors 511 and 515, the resistors 512 and 516, the resistors 513 and 517 and the resistors 514 and 518 are resistors individually having equal resistance values. Similarly, the capacitors 521 and 524, the capacitors 523 and 526 and the capacitors 522 and 525 are capacitors individually having equal capacitances. The transfer function of the filter of the figure can be presented by the following expression:

$$\frac{Vout}{Vin} = \frac{C3}{C2} \times \frac{s^2 + \frac{1}{C1 \times C3 \times R1 \times R2}}{s^2 + s \times \frac{1}{C2 \times R3} + \frac{1}{C1 \times C2 \times R2 \times R4}} \quad \text{[Math. 1]}$$

where Vout and Vin represent an input voltage and an output voltage of the antialiasing filter 250, respectively. The ratio between Vout and Vin represents the transfer function of the antialiasing filter 250. Further, C1 to C3 and R1 to R4 represent values of the passive elements of the antialiasing filter 250. C1 to C3 correspond to capacitance values of the capacitors 521 to 523 and 524 to 526 in FIG. 2, and R1 to R4 correspond to resistance values of the resistors 511 to 514 and 515 to 518.

From this expression, the cutoff frequency $\overline{\omega}_0$, quality factor Q and so forth of the antialiasing filter 250 can be calculated. The cutoff frequency $\overline{\omega}_0$ can be represented by the following expression.

$$\omega_0 = \sqrt{\frac{1}{C1 \times C2 \times R2 \times R4}} \quad \text{[Math. 2]}$$

Meanwhile, the quality factor Q can be represented by the following expression.

$$Q = \sqrt{\frac{C2 \times R3^2}{C1 \times R2 \times R4}} \quad \text{[Math. 3]}$$

It is to be noted that, by setting the value of C3 to "0," that is, by opening and removing C3, the signal transmission characteristic of the antialiasing filter 250 can be changed from a low pass characteristic to a band stop characteristic. In this case, the antialiasing filter 250 operates as a notch filter. The notch frequency r can be represented by the following expression.

$$\omega_z = \sqrt{\frac{1}{C1 \times C3 \times R1 \times R2}} \quad \text{[Math. 4]}$$

On the other hand, in the case where the antialiasing filter 250 is used as a notch filter, the attenuation amount in a region of a frequency higher than the stop band can be made greater than the attenuation amount in a region of a frequency lower than the stop band. Here, the attenuation amount in the region of the frequency higher than the stop band is called stop band attenuation amount. This stop band attenuation amount can be represented by the following expression.

$$\beta = \left(\frac{\omega_z}{\omega_0}\right)^2 = \frac{C2}{C3} \quad \text{[Math. 5]}$$

where β represents the stop band attenuation amount.

A characteristic value can be changed by changing the value of the passive elements of the antialiasing filter 250 in this manner. Consequently, one of the low pass characteristic and the band stop characteristic can be selected, and the cutoff frequency or the notch frequency can be changed. Here, the change of the value of the passive elements can be performed by a plurality of passive elements having different values from each other and a switch element for switching the plurality of passive elements. The control unit 270 performs selection of a signal transmission characteristic or selection of a cutoff frequency of the antialiasing filter 250 in response to the frequencies of the intermediate frequency signal and the interference signal or the like and calculates the value of the passive elements on the basis of a result of the selection of them. Then, the control unit 270 generates a control signal according to the value of the passive elements and outputs the control signal to the antialiasing filter 250. As the control signal, a signal for switching the switch element described above between on and off can be used.

[Example of Low Pass Characteristic]

Figures 4A, 4B:
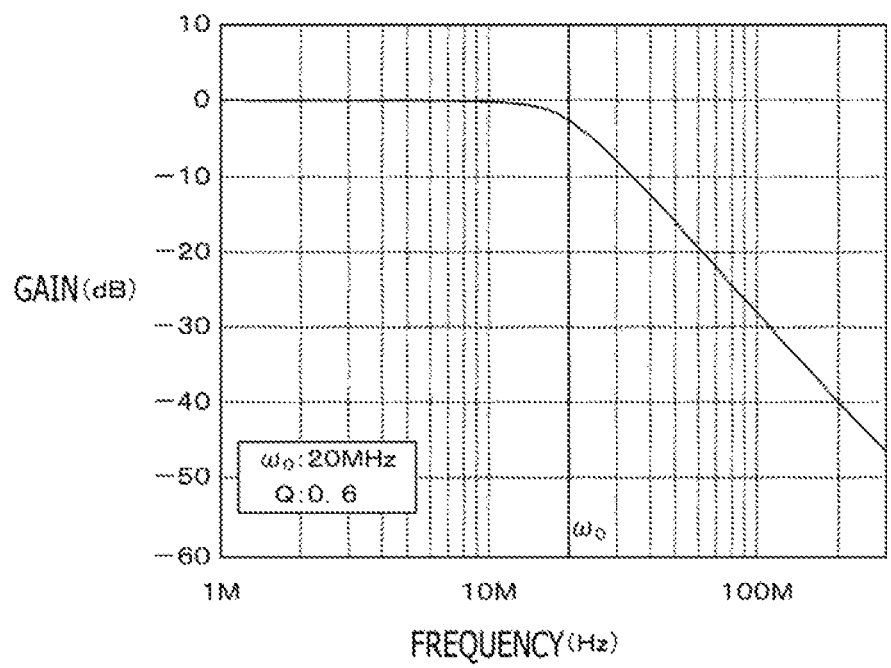
FIGS. 4A and 4B are views depicting an example of a low pass characteristic of the antialiasing filter 250 in the embodiments of the present technology.

FIGS. 4A and 4B are views depicting an example of the low pass characteristic of the antialiasing filter 250 in the embodiments of the present technology. FIG. 4A denotes a view representative of a frequency characteristic of the antialiasing filter 250. In the figure, the cutoff frequency $\overline{\omega}0$ is 20 MHz and the quality factor Q is 0.6. As represented by the figure, within a region of the frequency exceeding the cutoff frequency $\overline{\omega}0$, the characteristic is such that the gain decreases by a ratio of −40 dB/decade. Meanwhile, FIG. 4B represents values of the passive elements of the antialiasing filter 250. A symbol in each parentheses represents a resistor or a capacitor described hereinabove with reference to FIG. 3.

[Example of Band Stop Characteristic]

Figures 5A, 5B:
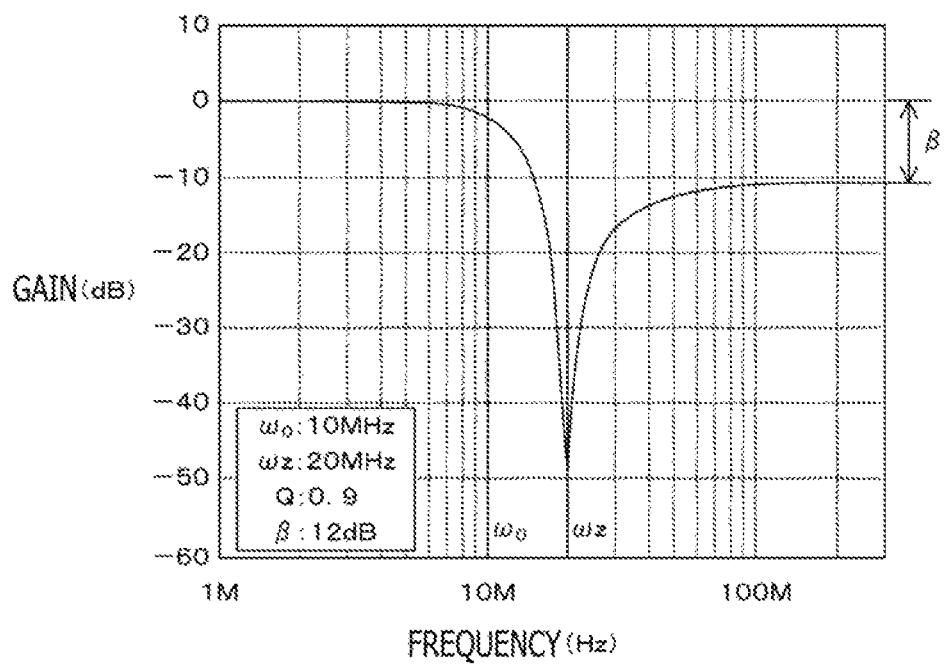
FIGS. 5A and 5B are views depicting an example of a band stop characteristic of the antialiasing filter 250 in the embodiments of the present technology.

FIGS. 5A and 5B are views depicting an example of the band stop characteristic of the antialiasing filter 250 in the embodiments of the present technology. FIG. 5A denotes a frequency characteristic of the antialiasing filter 250, and FIG. 5B denotes values of the passive elements.

As represented in FIG. 5A, the cutoff frequency $\overline{\omega}0$ is 10 MHz, the notch frequency $\overline{\omega}z$ is 20 MHz, the quality factor Q is 0.9, and the stop band attenuation amount β is 12 dB. If the frequency characteristic of FIG. 5A is compared with the frequency characteristic of "a" of FIG. 3, then from the frequency characteristic of FIG. 5A, it can be recognized that the quality factor Q is higher and the attenuation amount indicates a sudden increase at the notch frequency $\overline{\omega}z$. In other words, the attenuation amount of the interference signal can be increased within the region from the cutoff frequency $\overline{\omega}0$ to the notch frequency $\overline{\omega}z$. On the other hand, the stop band attenuation amount β of FIG. 5A is 12 dB. This represents that the attenuation amount in a high frequency region with respect to the attenuation amount in a low frequency region has a value lower by 12 dB. The frequency characteristic of FIG. 5A is a characteristic that indicates a small attenuation amount of a signal in a high frequency region in comparison with the frequency characteristic of "a" of FIG. 3.

[Signal Transmission Characteristic Selection Process]

Figure 6:
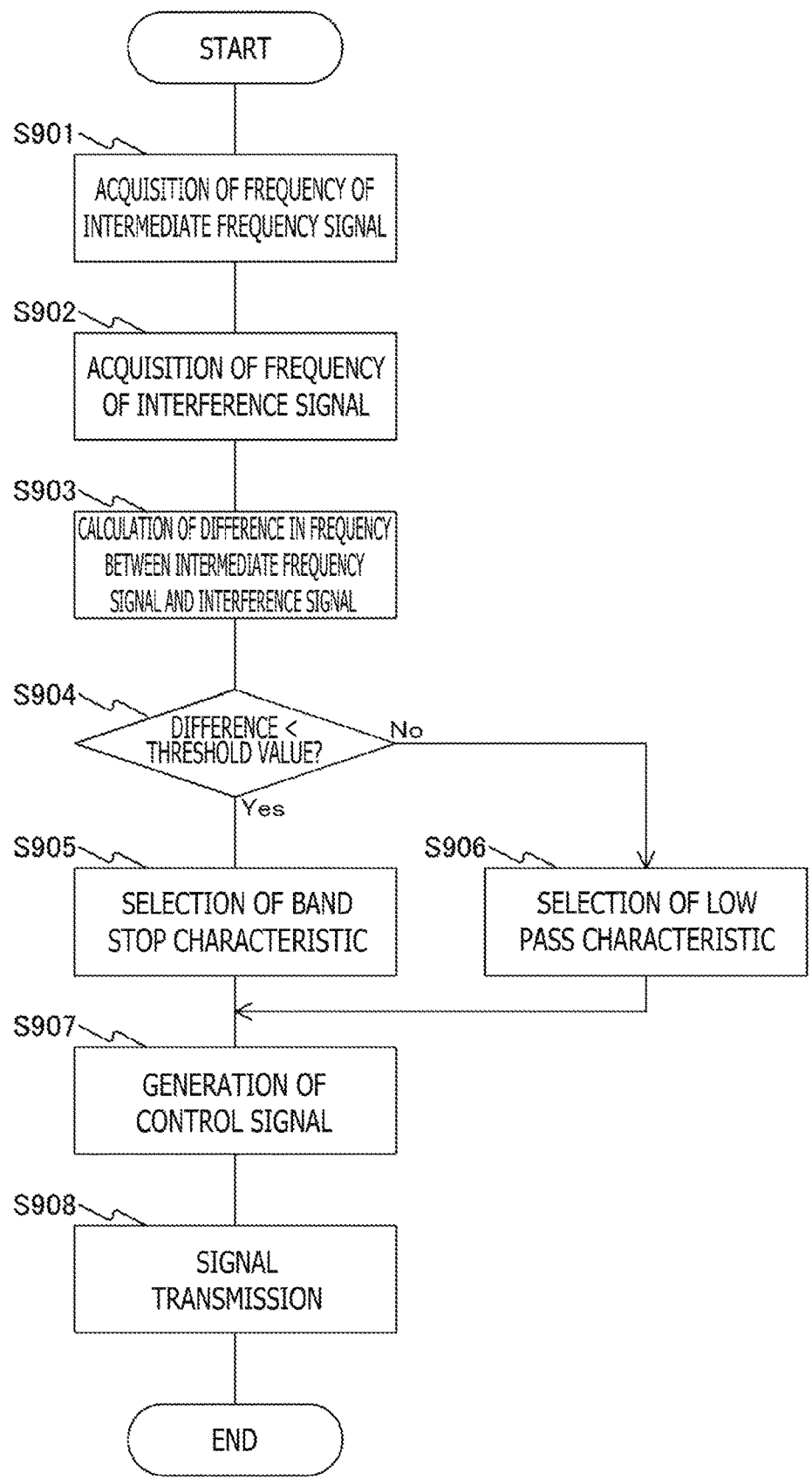
FIG. 6 is a view depicting an example of a processing procedure of a signal transmission characteristic selection process in the embodiments of the present technology.

FIG. 6 is a view depicting an example of a processing procedure of a signal transmission characteristic selection process in the embodiments of the present technology. The process of the figure represents a process by the control unit 270 and is a process executed in response to a change or the like of a reception channel by a user or the like.

First, the control unit 270 acquires a frequency of an intermediate frequency signal that is a desired signal (step S901). This can be performed by selecting a frequency of an intermediate frequency signal held in the control unit 270 in response to a broadcasting method or the like and acquiring the frequency. Then, the control unit 270 acquires a frequency of an interference signal (step S902). Similarly to step S901, this can be performed by acquiring a frequency of an interference signal held in the control unit 270. Then, the control unit 270 calculates the difference in frequency between the intermediate frequency signal and the interference signal (step S903). Then, the control unit 270 decides whether or not the difference is smaller than a predetermined threshold value (step S904).

In the case where the difference is smaller than the predetermined threshold value (step S904: Yes), the control unit 270 selects the band stop characteristic (step S905), and the processing advances to a process at step S907. On the other hand, in the case where the difference is not smaller than the threshold value (step S904: No), the control unit 270 selects the low pass characteristic (step S906) and advances the processing to step S907. At step S907, the control unit 270 generates a control signal according to the signal transmission characteristic selected at step S905 or step S906 (step S907) and outputs the control signal to the antialiasing filter 250. Thereafter, signal transmission is performed on the basis of the selected signal transmission characteristic (step S908). In particular, a process of passing the intermediate frequency signal and attenuating the interference signal is executed by the antialiasing filter 250.

In this manner, according to the first embodiment of the present technology, since the band stop characteristic or the low pass characteristic is selected as the signal transmission characteristic of the antialiasing filter 250 and attenuation of the interference signal or the like is performed, the configuration of the filter of the reception apparatus 200 can be simplified.

2. Second Embodiment

In the first embodiment described above, the frequency of an interference signal is specified on the basis of information held by the control unit 270. In contrast, in the second embodiment of the present technology, detection of an interference signal is performed and a frequency of the interference signal is specified. The second embodiment of the present technology is different from the first embodiment described hereinabove in that the signal transmission characteristic of the antialiasing filter 250 is changed in response to a detected interference signal.

[Configuration of Reception Apparatus]

Figure 7:
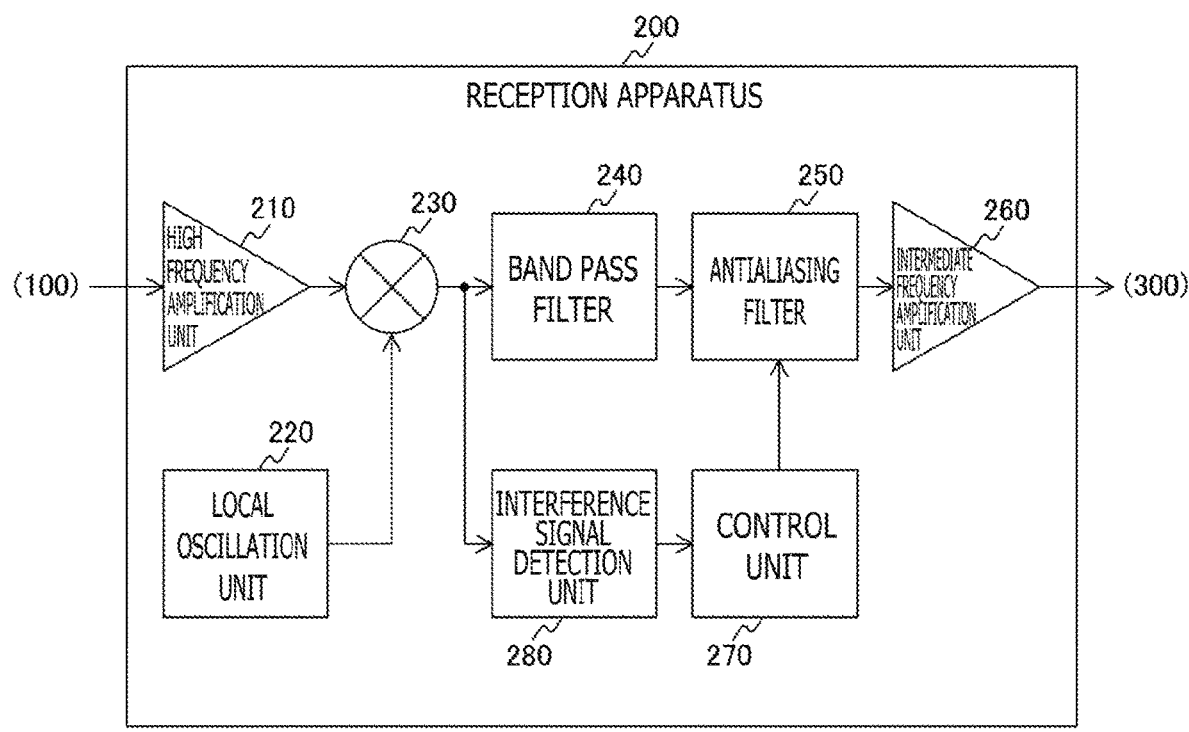
FIG. 7 is a view depicting an example of a configuration of a reception apparatus 200 in a second embodiment of the present technology.

FIG. 7 is a view depicting an example of a configuration of the reception apparatus 200 in the second embodiment of the present technology. The reception apparatus 200 of the figure is different from the reception apparatus 200 described hereinabove with reference to FIG. 2 in that it further includes an interference signal detection unit 280.

The interference signal detection unit 280 detects an interference signal from a signal outputted from the mixture unit 230 and outputs the interference signal to the control unit 270.

[Configuration of Interference Signal Detection Unit]

FIG. 8 is a view depicting an example of a configuration of the interference signal detection unit 280 in the second embodiment of the present technology. This interference signal detection unit 280 includes band pass filters #1 (281) to #3 (283), detectors #1 (284) to #3 (286), and a decision unit 287.

The band pass filters #1 (281) to #3 (283) are band pass filters having frequencies of pass bands different from one another and are filters that pass interference signals in the pass bands. In particular, the band pass filters #1 (281) to #3

(283) select interference signals of different frequencies individually corresponding to the pass bands and output the interference signals to the detectors #1 (284) to #3 (286), respectively.

The detectors #1 (284) to #3 (286) detect signals inputted thereto from the band pass filters #1 (281) to #3 (283), respectively. The detectors #1 (284) to #3 (286) detect interference waves selected by the band pass filters #1 (281) to #3 (283), respectively, and output signals after the detection to the decision unit 287.

The decision unit 287 performs decision of interference signals. This decision unit 287 decides, on the basis of the signals after detection outputted from the detectors #1 (284) to #3 (286), whether or not an interference signal exists in any of the pass bands of the band pass filters #1 (281) to #3 (283) and outputs a result of the decision to the control unit 270. This decision can be performed, for example, by selecting a signal of a signal level higher than a predetermined threshold value from among signals after detection outputted, for example, from the detector #1 (284) and so forth. In this case, the decision unit 287 can decide that an interference signal exists in the band of the band pass filter #1 (281) or the like according to the selected signal. The decision unit 287 outputs the interference signal based on the result of the decision to the control unit 270.

The control unit 270 in the second embodiment of the present technology generates a control signal on the basis of the intermediate frequency signal and the interference signal outputted from the interference signal detection unit 280 and outputs the control signal to the antialiasing filter 250.

The configuration of the other part of the reception apparatus 200 is similar to that of the reception apparatus 200 of the first embodiment of the present technology, and therefore, description of the same is omitted.

In this manner, with the second embodiment of the present technology, since a signal transmission characteristic of the antialiasing filter 250 is selected on the basis of an interference signal detected by the interference signal detection unit 280, the capability of removing an interference signal can be enhanced.

It is to be noted that the embodiments described above indicate an example for embodying the present technology, and the matters in the embodiments and specific matters of the invention in the claims individually have corresponding relations. Similarly, the specific matters of the invention in the claims and matters in the embodiments of the present technology to which same names as those in the claims are applied individually have corresponding relations. However, the present technology is not restricted to the embodiments and can be embodied by applying various modifications to the embodiments without departing from the subject matter of the present technology.

Further, the processing procedures described in the foregoing description of the embodiments may be grasped as a method having such a series of procedures or may be grasped as a program for causing a computer to execute such a series of procedures or a recording medium that stores the program. As this recording medium, for example, a CD (Compact Disc), an MD (MiniDisc), a DVD (Digital Versatile Disc), a memory card, a Blu-ray disc (Blu-ray (registered trade mark) Disc) and so forth can be used.

It is to be noted that the advantageous effects described herein are exemplary to the last and not necessarily restrictive and some other effects may be involved.

It is to be noted that the present technology can take the following configuration.

(1) A reception apparatus, including:
a filter configured to select a signal transmission characteristic that is one of a band stop characteristic and a low pass characteristic in response to a desired signal and an interference signal.

(2) The reception apparatus according to (1) above, in which the band stop characteristic of the filter is a characteristic that an attenuation amount in a region of a frequency higher than a stop band is greater than an attenuation amount in a region of a frequency lower than the stop band.

(3) The reception apparatus according to (1) or (2) above, in which the filter selects the signal transmission characteristic by changing a characteristic value of the filter.

(4) The reception apparatus according to any one of (1) to (3) above, in which the filter selects the signal transmission characteristic in response to a difference between a frequency of the desired signal and a central frequency of the interference signal.

(5) The reception apparatus according to any one of (1) to (3) above, in which the filter selects the signal transmission characteristic in response to a difference in signal level between the desired signal and the interference signal.

(6) The reception apparatus according to any one of (1) to (5) above, in which the filter changes a central frequency of a stop band in the band stop characteristic in response to the interference signal.

(7) The reception apparatus according to any one of (1) to (6) above, in which the filter changes a cutoff frequency in response to the desired signal and the interference signal.

(8) The reception apparatus according to (7) above, in which the filter changes the cutoff frequency to a frequency between frequencies of the desired signal and the interference signals.

(9) The reception apparatus according to any one of (1) to (8) above, further including:
a control unit configured to generate a control signal in response to the desired signal and the interference signal, in which
the filter selects the signal transmission characteristic based on the generated control signal.

(10) The reception apparatus according to (9) above, further including:
an interference signal detection unit configured to detect the interference signal, in which
the control unit generates the control signal in response to the desired signal and the detected interference signal.

(11) A reception method, including:
a selection procedure for selecting a signal transmission characteristic that is one of a band stop characteristic and a low pass characteristic in response to a desired signal and an interference signal.

REFERENCE SIGNS LIST

10 Image-receiving apparatus
100 Antenna
200 Reception apparatus
210 High frequency amplification unit
220 Local oscillation unit
230 Mixture unit
240, 281 to 283 Band pass filter
250 Antialiasing filter
260 Intermediate frequency amplification unit
270 Control unit
280 Interference signal detection unit
284 to 286 Detector
287 Decision unit 300 Analog-to-digital conversion apparatus
400 Demodulation apparatus
501, 502 Amplifier
511 to 518 Resistor
521 to 526 Capacitor

The invention claimed is:

1. A reception apparatus, comprising:
   a control circuit configured to compare a difference, between a frequency of a desired signal and a central frequency of an interference signal, and a specific threshold value; and
   a filter configured to:
      select one of a band stop characteristic or a low pass characteristic as a signal transmission characteristic of the filter based on a result of the comparison,
      set, based on the selection of the band stop characteristic, a first frequency of the filter, wherein the first frequency is between an upper limit for a band of the frequency of the desired signal and the central frequency of the interference signal, and
      set, based on the selection of the low pass characteristic, a second frequency of the filter, wherein the second frequency is higher than the upper limit for the band of the frequency of the desired signal.

2. The reception apparatus according to claim 1, wherein the band stop characteristic of the filter is a characteristic that an attenuation amount in a region of a frequency higher than a stop band is greater than an attenuation amount in a region of a frequency lower than the stop band.

3. The reception apparatus according to claim 1, wherein the filter is further configured to select the signal transmission characteristic based on change of a characteristic value of the filter.

4. The reception apparatus according to claim 1, wherein the filter is further configured to select the signal transmission characteristic based on a difference in signal level between the desired signal and the interference signal.

5. The reception apparatus according to claim 1, wherein the filter is further configured to change a central frequency of a stop band in the band stop characteristic based on the interference signal.

6. The reception apparatus according to claim 1, wherein the filter is further configured to change a cutoff frequency based on the desired signal and the interference signal.

7. The reception apparatus according to claim 6, wherein the filter is further configured to change the cutoff frequency to a frequency between frequencies of the desired signal and the interference signal.

8. The reception apparatus according to claim 1, wherein
   the control circuit is further configured to generate a control signal based on the desired signal and the interference signal, and
   the filter is further configured to select the signal transmission characteristic based on the generated control signal.

9. The reception apparatus according to claim 8, further comprising an interference signal detection circuit configured to detect the interference signal, wherein the control signal is generated based on the desired signal and the detected interference signal.

10. A reception method, comprising:
    comparing a difference, between a frequency of a desired signal and a central frequency of an interference signal, and a specific threshold value;
    selecting one of a band stop characteristic or a low pass characteristic as a signal transmission characteristic of a filter based on a result of the comparison;
    setting, based on the selection of the band stop characteristic, a first frequency of the filter, wherein the first frequency is between an upper limit for a band of the frequency of the desired signal and the central frequency of the interference signal; and
    setting, based on the selection of the low pass characteristic, a second frequency of the filter, wherein the second frequency is higher than the upper limit for the band of the frequency of the desired signal.

* * * * *